United States Patent [19]
Gardner et al.

[11] Patent Number: 6,064,102
[45] Date of Patent: May 16, 2000

[54] SEMICONDUCTOR DEVICE HAVING GATE ELECTRODES WITH DIFFERENT GATE INSULATORS AND FABRICATION THEREOF

[75] Inventors: Mark I. Gardner, Cedar Creek; H. Jim Fulford, Austin; Thomas E. Spikes, Jr., Round Rock, all of Tex.

[73] Assignee: Advanced Micro Devices, Inc., Sunnyvale, Calif.

[21] Appl. No.: 08/992,318

[22] Filed: Dec. 17, 1997

[51] Int. Cl.⁷ .................................................. H01L 29/76
[52] U.S. Cl. .......................... 257/410; 257/391; 257/406; 257/411
[58] Field of Search .................................... 257/405, 406, 257/411, 501, 315, 316, 318, 319, 320, 410, 392, 401, 402, 391; 438/591, 287

[56] References Cited

U.S. PATENT DOCUMENTS

| | | | |
|---|---|---|---|
| 4,257,832 | 3/1981 | Schwabe et al. | 438/287 |
| 4,342,149 | 8/1982 | Jacobs et al. | 29/576 |
| 4,460,980 | 7/1984 | Hagiwara et al. | 257/401 |
| 5,258,645 | 11/1993 | Sato | 257/392 |
| 5,496,753 | 3/1996 | Sakurai et al. | 438/591 |
| 5,520,992 | 5/1996 | Douglas et al. | 428/209 |

*Primary Examiner*—Donald L. Monin, Jr.
*Assistant Examiner*—Michael Dietrich

[57] ABSTRACT

A semiconductor device having gate electrodes with different gate insulators and a process for fabricating such device is provided. Consistent with one embodiment of the invention, a semiconductor device is provided in which a first gate insulator is formed over a first region of a substrate. A second gate insulator, different than the first gate insulator, is formed over a second region of the substrate. Finally, one or more gate electrodes are formed over each of the first and second gate insulators. The first gate insulator may, for example, have a permittivity and/or a thickness which is different from that of the second gate insulator. For example, the first gate insulator may have a permittivity greater than 20, and the second gate insulator may have a permittivity less than 10.

8 Claims, 6 Drawing Sheets

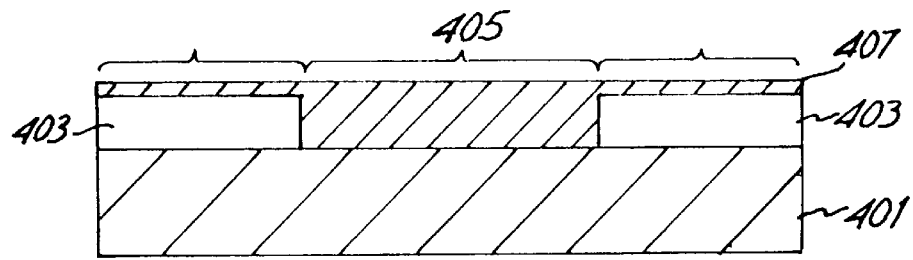
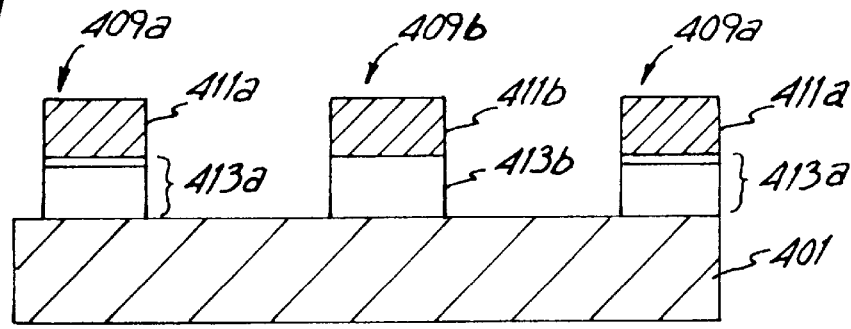
Fig.4A
Fig.4B
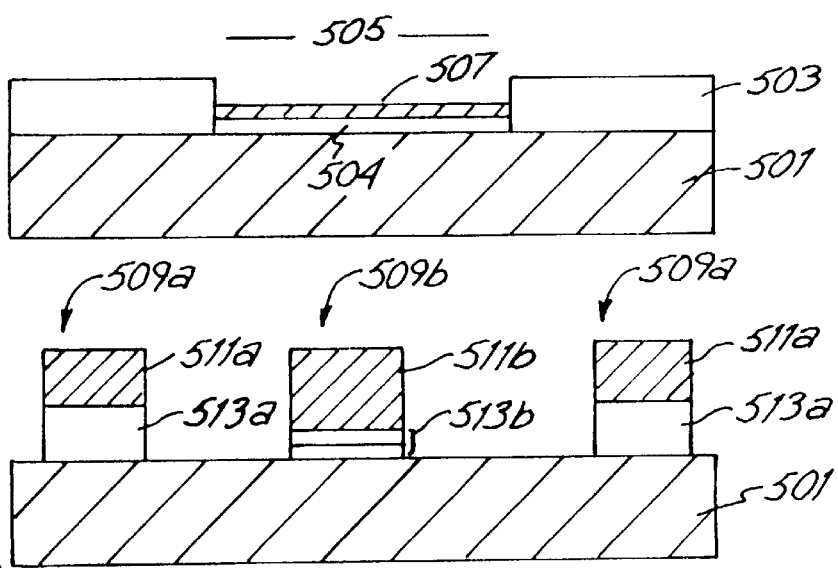
Fig.5A
Fig.5B

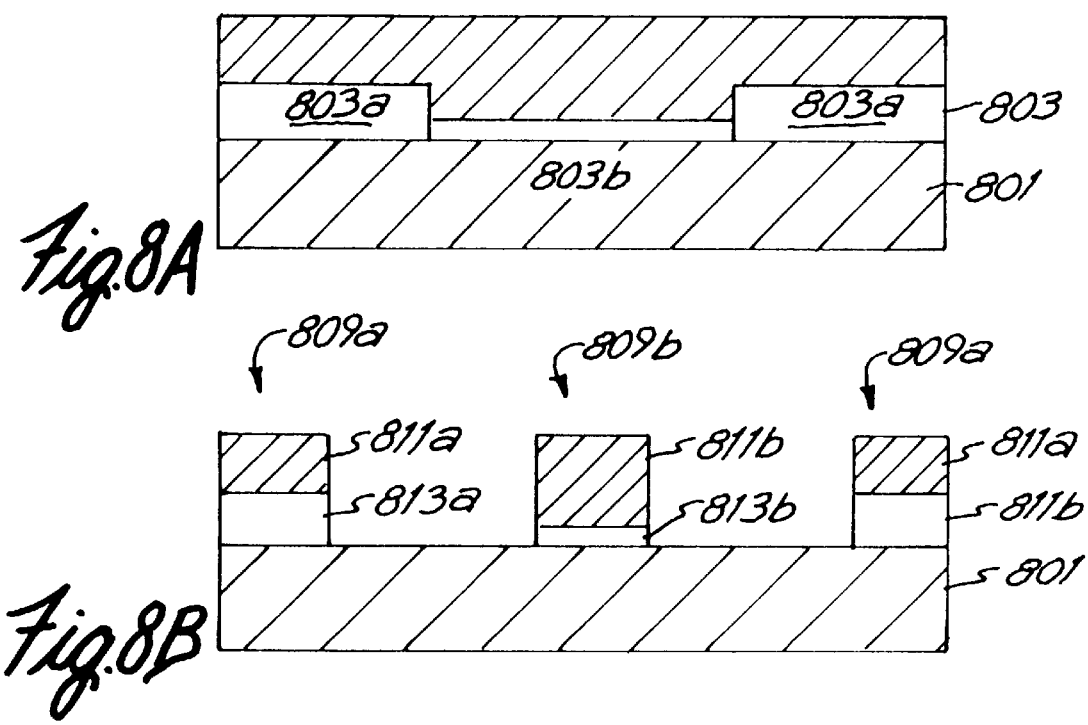

SEMICONDUCTOR DEVICE HAVING GATE ELECTRODES WITH DIFFERENT GATE INSULATORS AND FABRICATION THEREOF

FIELD OF THE INVENTION

The present invention generally relates to semiconductor devices and, more particularly, to a semiconductor device having gate electrodes with different gate insulators and a process for fabricating such device.

BACKGROUND OF THE INVENTION

Over the last few decades, the electronics industry has undergone a revolution by the use of semiconductor technology to fabricate small, highly integrated electronic devices. The most common semiconductor technology presently used is silicon-based. A large variety of semiconductor devices have been manufactured having various applicability and numerous disciplines. One such silicon-based semiconductor device is a metal-oxide-semiconductor (MOS) transistor.

The principal elements of a typical MOS semiconductor device are illustrated in FIG. 1. The device generally includes a gate electrode 103, which acts as a conductor, to which an input signal is typically applied via a gate terminal (not shown). Heavily doped source/drain regions 105 are formed in a semiconductor substrate 101 and are respectively connected to source and drain terminals (not shown). A channel region 107 is formed in the semiconductor substrate 101 beneath the gate electrode 103 and separates the source/drain regions 105. The channel is typically lightly doped with a dopant type opposite to that of the source/drain regions 105. The gate electrode 103 is physically separated from the semiconductor substrate 101 by a gate insulating layer 109, typically an oxide layer such as $SiO_2$. The insulating layer 109 is provided to prevent current from flowing between the gate electrode 103 and the source/drain regions 105 or channel region 107.

In operation, an output voltage is typically developed between the source and drain terminals. When an input voltage is applied to the gate electrode 103, a transverse electric field is set up in the channel region 107. By varying the transverse electric field, it is possible to modulate the conductance of the channel region 107 between the source region/drain regions 105. In this manner an electric field controls the current flow through the channel region 107. This type of device is commonly referred to as a MOS field-effect-transistors (MOSFET).

Semiconductor devices, like the one described above, are used in large numbers to construct most modern electronic devices. In order to increase the capability of such electronic devices, it is necessary to integrate even larger numbers of such devices into a single silicon wafer. As the semiconductor devices are scaled down (i.e., made smaller) in order to form a larger number of devices on a given surface area, the structure of the devices and fabrication techniques used to make such devices must be altered.

A typical MOS device includes a large number of gate electrodes. One important step in the fabrication of the gate electrodes on a MOS device is the formation of the gate insulating layer. Conventional fabrication techniques provide A common insulating layer, typically an oxide layer, for each gate electrode on the substrate. The gate oxide layer is typically grown in active regions of the device. In order to obtain a high-quality gate oxide layer, the surface of the active area is often wet-etched to remove any residual oxide. The gate oxide layer is then grown slowly, typically through dry oxidation in a chlorine bearing ambient.

The above described conventional techniques for forming gate oxide layers impose limitations on the fabrication of devices. In particular, the use of a common insulating layer to form gate insulating layers for each gate electrode can impose limitations on subsequent gate electrode formation and inhibit optimization of transistor performance.

SUMMARY OF THE INVENTION

The present invention generally provides a semiconductor device having gate electrodes with different gate insulators and a process for fabricating such device. Consistent with one embodiment of the invention, a process of fabricating a semiconductor device is provided in which a first gate insulator is formed over a first region of a substrate. A second gate insulator, different than the first gate insulator, is formed over a second region of the substrate. Finally, one or more gate electrodes are formed over each of the first and second gate insulators. The first gate insulator may have a permittivity and/or a thickness which is different from that of the second gate insulator. For example, the first gate insulator may have a permittivity greater than 20, and the second gate insulator may have a permittivity less than 10.

A semiconductor device consistent with one embodiment of the invention includes a substrate and first and second gate electrodes stacks. The first gate electrode stack includes a first gate electrode and a first gate insulator interfacing with the first gate electrode and the substrate. The second gate electrode stack includes a second gate electrode and a second gate insulator interfacing the with the second gate electrode and the substrate. The second gate insulator is different then the first gate insulator. For example, the first and second gate insulators may have different permittivities and/or thicknesses. In one particular embodiment, the first gate insulator has a permittivity greater than 20 and the second gate insulator has a permittivity less than 10.

The above summary of the present invention is not intended to describe each illustrated embodiment or every implementation of the present invention. The figures and the detailed description which follow more particularly exemplify these embodiments.

BRIEF DESCRIPTION OF THE DRAWINGS

The invention may be more completely understood in consideration of the following detailed description of various embodiments of the invention in connection with the accompanying drawings, in which:

FIGS. 4A–4B illustrate fabrication process in accordance with another embodiment of the invention;

FIGS. 5A–5B illustrate fabrication process in accordance with another embodiment of the invention;

FIGS. 8A–8B illustrates another exemplary fabrication process in accordance with still another embodiment of the invention.

Figure 1:
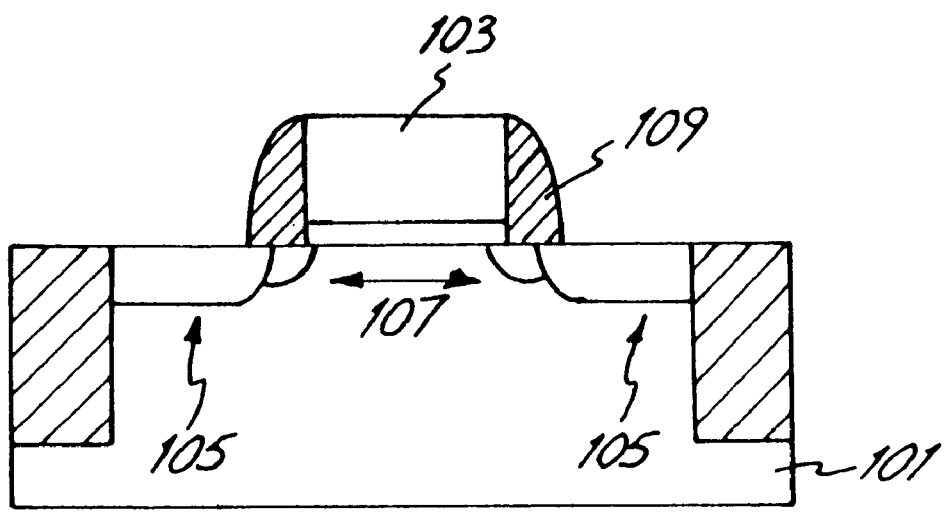
FIG. 1 illustrates a conventional MOS transistor.

While the invention is amenable to various modifications and alternative forms, specifics thereof have been shown by way of example in the drawings and will be described in detail. It should be understood, however, that the intention is not to limit the invention to the particular embodiments described. On the contrary, the intention is to cover all modifications, equivalents, and alternatives falling within the spirit and scope of the invention as defined by the appended claims.

DETAILED DESCRIPTION OF THE DRAWINGS

The present invention is believed to be applicable to a number of semiconductor devices using gate electrodes. Such semiconductor devices may include MOS, CMOS, and BiCMOS devices, for example. While the present invention is not so limited, an appreciation of various aspects of the invention will be gained through a discussion of the fabrication process in connection with the examples provided below.

Figure 2A:
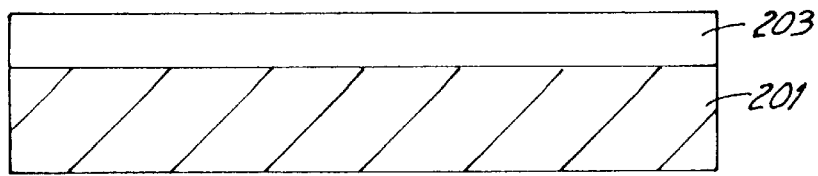
FIG. 2A–2E illustrate an exemplary fabrication process in accordance with one embodiment of the invention.

FIGS. 2A–2E illustrate an exemplary process for fabricating a semiconductor device having gate electrodes separated from a substrate by different gate insulators. The term gate insulator as used herein refers to the entire dielectric region separating a gate electrode from the surface of a substrate, whether the dielectric region is formed from one or multiple layers. Consistent with this process, a gate insulating layer 203 is formed over a substrate 201. The resultant structure is illustrated in FIG. 2A. In this process, the gate insulating layer 203 will be used as the gate insulator for one or more gate electrodes. The gate insulating layer 203 may be formed from a number of different dielectric materials including, for example, relatively high permittivity (i.e., dielectric constant) materials. Exemplary high permittivity materials include barium strontium titanate, titanium oxide, tantalum oxide and lead zirconate titantate, for example. Each of these materials typically has a higher permittivity than that of silicon dioxide (permittivity of about 4) normally used to form gate insulators of conventional devices.

Figure 2B:
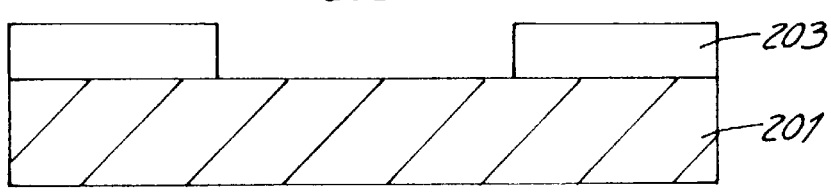

Portions of the first gate insulating layer 203 are removed in one or more regions (only one of which is shown) of the substrate 201. In the region 205, the gate insulating layer 203 may be removed to expose the surface of the substrate 201, as illustrated in FIG. 2B. Removal of portions of the gate insulating layer 203 may be done using, for example, well-known photolithography and etching techniques.

Figure 2C:
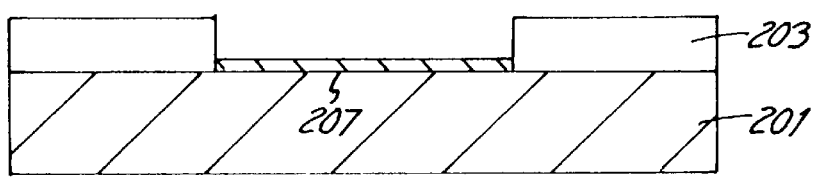

A second gate insulating layer 207 is formed over the substrate 201 in region 205, as illustrated in FIG. 2C. In this exemplary process, the second gate insulating layer 207 will be used as the gate insulator for one or more gate electrodes and differs from the first gate insulating layer 203 in thickness. The second gate insulating layer 207 may also have a different permittivity than that of the first gate insulating layer 203. The second gate insulating layer 207 may be formed from a number of different dielectric materials including, for example, oxides such as silicon dioxide, nitrides, or even high permittivity materials. The gate insulating layer 207 may further be formed using a number of different techniques including, for example, growth or deposition techniques.

Using one technique, the gate insulating layer 203 is etched to expose the substrate surface in region 205 and an oxide, such as $SiO_2$ is grown on the substrate 201 in region 205. The oxide forms the second gate insulating layer. In accordance with another technique, a layer of dielectric material (e.g., an oxide) is deposited over the structure illustrated in FIG. 2B. Portions of the deposited dielectric layer are then removed from over the first gate insulating layer 203 to form the gate insulating layer 207 as illustrated in FIG. 2C. Typically, the etchants used to remove the deposited dielectric material are selective to the first gate insulating layer 203 and leave the first gate insulating layer 203 substantially intact.

Figure 2D:
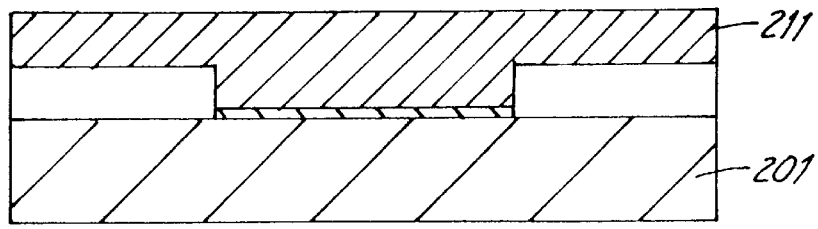

Continuing with the exemplary flow, a gate electrode layer 211 is formed over the substrate 201, as illustrated in FIG. 2D. The gate electrode layer 211 may be formed from a number of different materials including polysilicon or metals such as titanium, copper, or cobalt, for example. The gate electrode layer 211 may be formed using, for example, well-knowing deposition techniques. After deposition, the gate electrode layer 211 may be planarized if desired.

The gate electrode layer 211 will be used to form one or more gate electrodes over each of the first and second gate insulating layers 205 and 207. The thickness of the gate electrode layer 211 is suitably selected in consideration of the desired thicknesses of the gate electrodes, taking into account any height differential between the first and second gate insulating layers 203 and 207. Suitable thicknesses of the gate insulating layer 211 (measured from the top of the first gate insulating layer 203) range from about 2,000 to 6,000 Å for many applications.

Figure 2E:
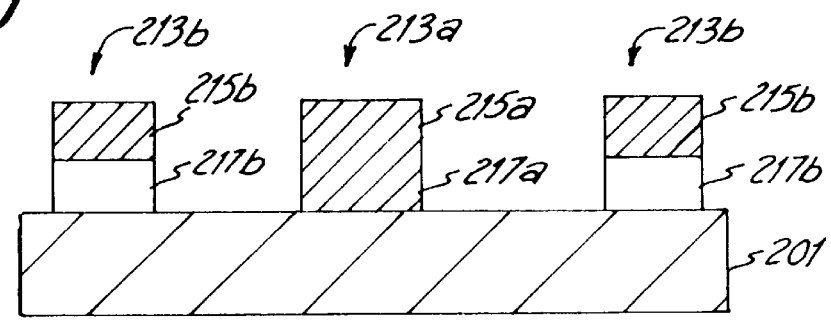

Portions of the gate electrode layer 211 and typically the underlying gate insulating layer 203 or 207 are removed to form one or more gate electrodes over each of the gate insulating layers 205 and 207, as illustrated in FIG. 2E. This removal process may be performed using, for example, well-known photolithography and etching techniques. Fabrication may continue with well-known processing steps including, for example, source/drain formation, silicidation, interconnect formation and so forth to complete the ultimate device structure.

The structure illustrated in FIG. 2E depicts a gate electrode stack 213a including a gate electrode 215a formed from the gate electrode layer 211 and a gate insulator 217a formed from the second gate insulating layer 207. The structure of FIG. 2E further depicts two gate electrode stacks 213b having gate electrodes 215a formed from the gate insulating layer 211 and gate insulators 217b formed from the first gate insulating layer 203. Each of the gate insulators 217a and 217b directly interface with the base of the respective gate electrode 215a or 215b and the surface of the substrate 201.

In the illustrated embodiment, the first and second gate insulators 217a and 217b differ in thickness and may also, differ in permittivity as well. For example, the gate insulators 217b may be formed from a high permittivity material having a dielectric constant greater than 20, (e.g., a barium strontium titanate) while the thinner gate insulator 217a may be formed from a material having a smaller permittivity. The thinner gate insulator 217c may be formed from a dielectric material having a permittivity less than 10, such as $SiO_2$ or silicon nitride for example. Moreover, while the gate insulator 213a and 213b may have different permittivities and thickness, the gate insulators 213a and 213b may, for example, have equivalent permittivity (k) to gate insulator depth/thickness (d) ratios k:d. For example, about 200 Å of a material having a permittivity of 40 (i.e., a k/d ratio of 5) may be used for gate insulators 213b while, 20 Å of $SiO_2$ having a permittivity of about 4 (i.e., a k/d ration of about 5) may be used for gate insulator 217a.

Using the above process, a semiconductor device having gate electrodes with different gate insulators can be formed.

The thickness and permittivity of each gate insulator may be selected to optimize the performance of the associated transistor. This can enhance device performance by, for example, increasing the operating speeds of the transistors on the device as well as increasing their reliability.

Figure 3A:
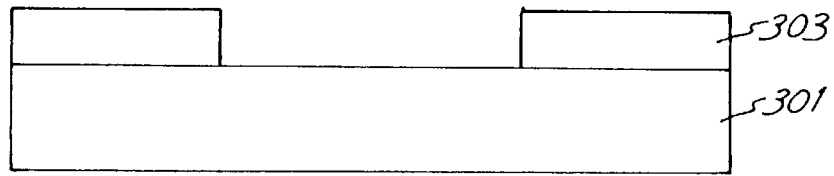
FIGS. 3A–3D illustrate an exemplary fabrication process in accordance with another embodiment of the invention.
Figure 3B:
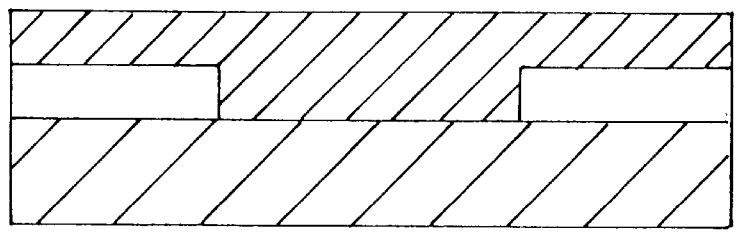

FIGS. 3A–3E illustrate another process for forming a semiconductor device having gate electrodes with different gate insulators. In accordance with this exemplary process, a first gate insulating layer 303 is formed over substrate 301. Portions of the gate insulating layer 303 in one or more regions 305 are removed. The resultant structure is illustrated in FIG. 3A. Formation and selective removal of portions of the gate insulating layer 303 may, for example, be performed in a similar manner as discussed above with respect to FIGS. 2A–2B. The remaining portions of the first gate insulating layer will be used as gate insulators for one or more gate electrode.

A second gate insulating layer 307 is formed over the substrate 301 and in the region 305, as illustrated in FIG. 22. The second gate insulating layer 307 will be used as a gate insulator for one or more gate electrodes and differs from the first gate insulating layer with respect to permittivity. The second gate insulating layer 207 may be formed of a number of different dielectrics using, for example, well-known deposition techniques. The dielectric layer 207 may be formed from a number of different dielectric materials including, for example, high permittivity materials.

Figure 3C:
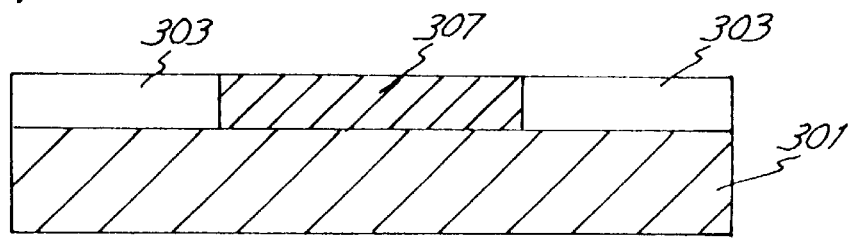
Figure 3D:
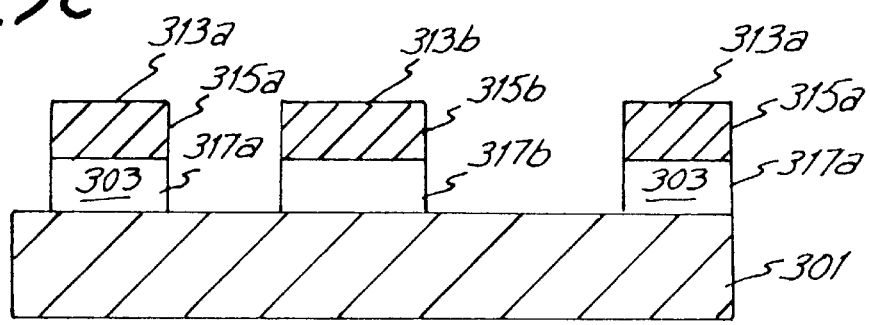

The gate insulating layer 307 is planarized with an upper surface of the first gate insulating layer 303, as shown in FIG. 3C. The planarization provides each gate insulating layer with about the same thickness. The planarization may be done using, for example, well-known chemical-mechanical polishing techniques. These techniques typically involve the use of etchants. These etchants used to remove the second gate insulating layer 307 may be selective to the first gate insulating layer 303 and leave the first gate insulating layer intact. Alternatively, the planarization technique may use etchants which etch both the first and second gate insulating layer 303 and 307 at a similar rate. In this manner the thickness of both gate insulating layers 303 and 307 can be reduced while maintaining substantially equivalent thicknesses.

A gate electrode layer is formed over the substrate 301 and portions of the gate electrode layer as well as underlying portions of the first and second gate insulating layers 303 and 307 are selectively removed to form a plurality of gate electrode stacks over the substrate 301. The resultant structure illustrated in FIG. 3D. Formation and selective removal of the gate electrode layer and the gate insulating layers 303 and 307 may be performed using, for example, well-known photolithography and etching techniques. The structure illustrated in FIG. 3D includes two gate electrode stacks 313a each having a gate electrode 315a formed from the gate electrode layer and a gate insulator 317a formed from the first gate insulating layer 303. The illustrated structure of FIG. 3D further depicts a second gate electrode stack 313d having a gate electrode 315b formed from the gate electrode layer and a gate insulator 317b formed from the second gate insulating layer 307. The second gate insulator 317b has the same height/thickness as the gate insulator 317a but differs in permittivity form the gate insulators 317a.

FIGS. 4A–4B illustrate another exemplary process for fabricating a semiconductor device having gate electrodes with different gate insulators. In accordance with this exemplary process, a first gate insulating layer 403 is formed over the substrate 401. Portions of the gate insulating layer 403 in one or more regions 405 are removed. Formation and selective removal of portion of the gate insulating layer 403 may, for example, be performed in a similar manner as discussed above with respect to FIGS. 2A–2B. In this example, the gate insulating layer 403 is removed from the surface of the substrate in regions 405 and remains in regions 406. A second gate insulating layer 407 of a different dielectric material than the first gate insulating layer 403 is formed over the substrate 401. The resultant and structure is illustrated in FIG. 4A.

The second gate insulating layer 407 may be formed using, for example, well-known deposition techniques. After deposition, the second gate insulating layer 407 may be planarized if desired. Over the regions 406, the gate insulating layer 403 and portions of the second gate insulating layer 407 will be used as a gate insulator for one or more gate electrodes. In regions 405, the first gate insulating layer 407 alone will be used as a gate insulator for one or more gate electrodes.

A gate electrode layer is formed over the substrate 401 using, for example, well-known deposition techniques. Portions of the gate electrode layer as well as underlying portions of the first and second gate insulating layers 403 and 407 are selectively removed to form a plurality of gate electrode stacks over the substrate 401. This removal process may be performed using, for example, well-known photolithography and etching techniques. The resultant structure illustrated in FIG. 4B includes two gate electrode stacks 409a each having a gate electrode 411a formed from the gate electrode layer and a gate insulator 413a formed from the first gate insulating layer 403 and a portion of the second gate insulating layer 407. The structure of FIG. 4B also includes a second gate electrode stack 409b having a gate electrode 411b formed from the gate electrode layer and gate insulator 413b formed from the second gate insulating layer 407. While the gate insulators 413a and 413b may have similar thicknesses, they differ with respect to their composition and typically their permittivities.

FIGS. 5A–5B illustrate another exemplary process for forming a semiconductor device having gate electrodes with different gate insulators. In accordance with this process, a first gate insulating layer 503 is formed over a substrate 501. A portion of the first gate insulating layer 503 in one or more regions 505 are removed. In this exemplary process, removal of part of the first gate insulating layer 503 leaves a thinner layer 504 of the gate insulating layer 503 in the region 305. Formation and selective removal of the gate insulating layer 503 may, for example, be done in a similar manner as discussed above. A second gate insulating layer 507 is formed in the region 505 where portions of the first gate insulating layer 503 were removed. The second gate insulating layer 507 may, for example, be formed by depositing a layer of dielectric material over the substrate 501 and selectively removing portion of the dielectric layer to form the second gate insulating layer 507 as shown in FIG. 5A. Selective removal of the dielectric layer may, for example, be performed using well-known polishing techniques.

A gate electrode layer is formed over the substrate 501 using, for example, well-known deposition techniques. Portions of the gate electrode layer as well as underlying portions of the first and second gate insulating layers 503 and 507 are selectively removed to form a plurality of gate electrode stacks over the substrate 501. This removal process may be performed using, for example, well-known photolithography and etching techniques. The resultant structure illustrated in FIG. 5B includes two gate electrode stacks 509a each having a gate electrode 511a formed from the gate electrode layer and a gate insulator 513a formed from the first gate insulating layer 503. The structure FIG. 5B also includes a second gate electrode stack 509b having a gate electrode 511b formed from the gate electrode layer and a gate insulator 513b formed from the second gate insulating layer 507 and the thinner portion 504 of the first gate insulating layer 503. The gate insulator 513b generally differs from the gate insulator 513a with respect thickness 513a and 513b and may also vary with respect to permittivity. The gate insulators also differ in the number of dielectric layers from which they are formed.

Figure 6A:
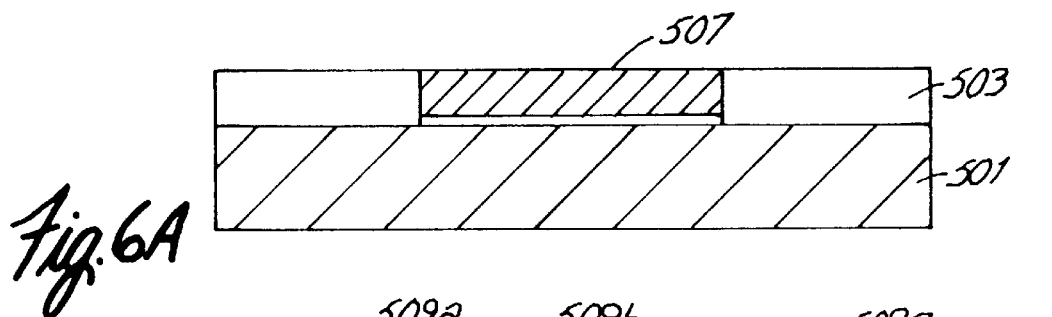
FIGS. 6A–6B illustrate a fabrication process in accordance with yet another embodiment of the invention.
Figure 6B:
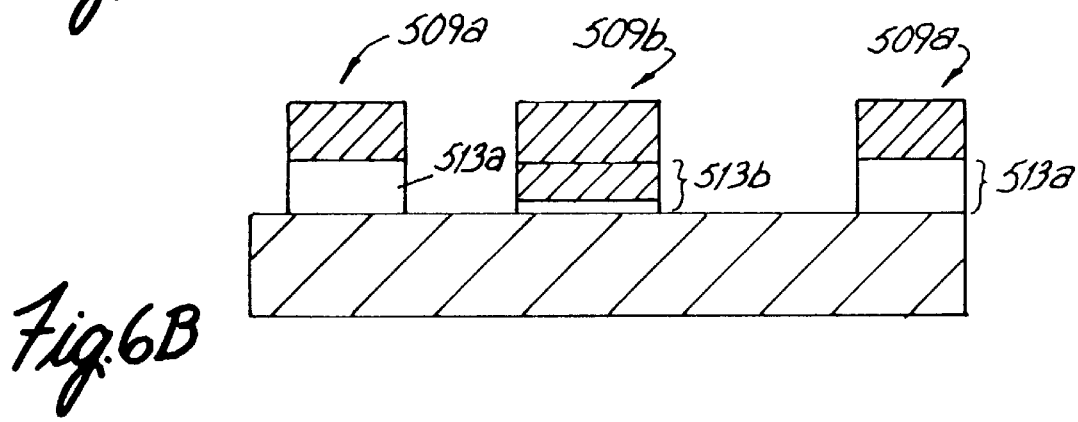

In an alternate embodiment illustrated in FIGS. 6A–6B, the second gate insulating layer 507 may be formed over the substrate 501 and planarized with an upper surface of the first gate insulating layer 503. This alternate process provides gate insulators 513a which have the same height/thickness as the gate insulator 513b, but which differ from the gate insulator 513b with respect to composition (e.g., the number of dielectric layers used to form the gate insulator) as well as permittivity.

Figure 7A:
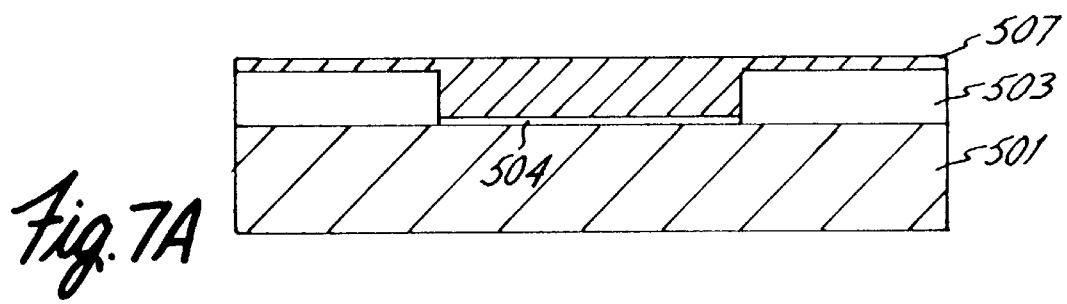
FIGS. 7A–7B illustrate another exemplary fabrication process in accordance with yet another embodiment of the invention.
Figure 7B:
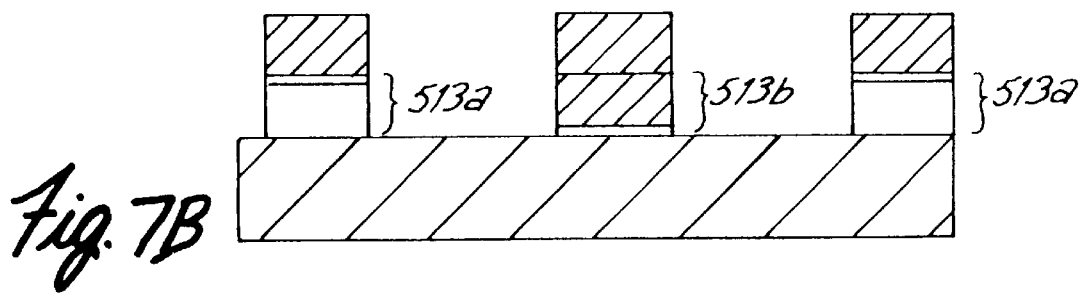

FIGS. 7A–7B illustrate yet another alternate embodiment in which the second gate insulating layer 507 is left over the elevated portion of the gate insulating layer 503 as well as the thin portion 504 of the gate insulating layer 503. This alternate process provides gate insulators 513a having a similar height/thickness as the gate insulator 513b, but which differ with respect to their permittivities and composition.

FIGS. 8A–8B illustrate yet another embodiment of the invention in which a semiconductor device having gate electrodes with different gate insulators is formed. In accordance with this exemplary process, the gate insulating layer 803 is formed over a substrate 801. Portions of the gate insulating layer 803 are removed to leave elevated portions 803a and thin portions 803b. A gate electrode layer 811 is then formed over the elevated portions 803a and thin portions 803b of the gate insulating layer 803. The resultant structure is illustrated in FIG. 8A. The gate electrode layer 811 may be formed using, for example, well-known deposition techniques.

Portions of the gate electrode layer 811 and underlying portions of the gate insulating layer 803 are removed to form a plurality of gate electrode stacks over the substrate 801. This removal process may be performed using, for example, well-known photolithography and etching techniques. The resultant structure illustrated in FIG. 8B includes two gate electrode stacks 809a each having a gate electrode 813a formed from the gate electrode layer 811 and a gate insulator 813a formed from the elevated portions 803a of the gate insulating layer 803. The structure of FIG. 8B also illustrates a second gate electrode stack 809b having a gate electrode 811b formed from the gate electrode layer and a gate insulator 813b formed from the thin portion 803b of the gate insulating layer 803. The gate insulators 813a and 813b, while being formed of the same material, differ with respect to thickness.

As noted above, the present invention is applicable to the fabrication of a number of different devices having gate electrodes formed over a substrate. Accordingly, the present invention should not be considered limited to the particular examples described above, but rather should be understood to cover all aspects of the invention as fairly set out in the attached claims. Various modifications, equivalent processes, as well as numerous structures to which the present invention may be applicable will be readily apparent to those of skill in the art to which the present invention is directed upon review of the present specification. The claims are intended to cover such modifications and devices

What is claimed is:

1. A semiconductor device, comprising:
   a substrate;
   at least a first gate electrode stack including a first gate electrode and a first gate insulator interfacing with the first gate electrode and the substrate; and
   at least a second gate electrode stack including a second gate electrode and a second gate insulator interfacing with the second gate electrode and the substrate;
   wherein the second gate insulator is different than the first gate insulator;
   wherein the first gate insulator has a permittivity different than a permittivity of the second gate insulator;
   wherein the first gate insulator and the second gate insulator have substantially the same thickness;
   wherein the first gate insulator has a permittivity greater than 20 and the second gate insulator has a permittivity less than 10.

2. The device of claim 1, wherein the second gate insulator has an upper surface interfacing with the second gate electrode and the first gate insulator has an upper surface interfacing with the first gate electrode, the upper surface of the second gate insulator and the upper surface of the first gate insulator lying in substantially the same plane.

3. The device of claim 1, wherein the first gate insulator has a different number of dielectric layers than the second gate insulator.

4. A semiconductor device, comprising:
   a substrate;
   at least a first gate electrode stack including a first gate electrode and a first gate insulator having an upper surface interfacing with the first gate electrode and a lower surface interfacing with the substrate, the first gate insulator having a first permittivity; and
   at least a second gate electrode stack including a second gate electrode and a second gate insulator having an upper surface, planar with the upper surface of the first gate insulator, interfacing with the second gate electrode and a lower surface interfacing with the substrate, the second gate insulator having a second permittivity different than the first permittivity;
   wherein the first gate insulator includes a thicker portion of a first gate insulating layer and the second gate insulator includes a thinner portion of the first gate insulating layer and a second gate insulating layer disposed on top of the thinner portion of the first gate insulating layer, wherein the combined thickness of the thinner portion of the first gate insulating layer and the second gate insulating layer is equivalent to the thickness of the thicker portion of the first gate insulating layer.

5. A semiconductor device, comprising:
   a substrate;
   at least a first gate electrode stack including a first gate electrode and a first gate insulator having an upper surface interfacing with the first gate electrode and a lower surface interfacing with the substrate, the first gate insulator having a first permittivity; and
   at least a second gate electrode stack including a second gate electrode and a second gate insulator having an upper surface, planar with the upper surface of the first gate insulator, interfacing with the second gate electrode and a lower surface interfacing with the substrate, the second gate insulator having a second permittivity different than the first permittivity;

wherein the first gate insulator includes a first gate insulating layer and a thinner portion of a second gate insulating layer disposed on top of the first gate insulating layer and the second gate insulator includes a thicker portion of the second gate insulating layer, wherein the combined thickness of the thinner portion of the second gate insulating layer and the first gate insulating layer is equivalent to the thickness of the thicker portion of the second gate insulating layer.

6. A semiconductor device, comprising:

a substrate;

at least a first gate electrode stack including a first gate electrode and a first gate insulator having an upper surface interfacing with the first gate electrode and a lower surface interfacing with the substrate, the first gate insulator having a first permittivity; and at least a second gate electrode stack including a second gate electrode and a second gate insulator having an upper surface, planar with the upper surface of the first gate insulator, interfacing with the second gate electrode and a lower surface interfacing with the substrate, the second gate insulator having a second permittivity different than the first permittivity;

wherein the first gate insulator includes a thicker portion of a first gate insulating layer and a thinner portion of a second gate insulating layer disposed on top of the thicker portion of the first gate insulating layer and the second gate insulator includes a thinner portion of the first gate insulating layer and a thicker portion of the second gate insulating layer disposed on top of the thinner portion of the first gate insulating layer, wherein the combined thickness of the thinner portion of the first gate insulating layer and the thicker portion of the second gate insulating layer is equivalent to the thickness of the thicker portion of the first gate insulating layer and the thinner portion of the second gate insulating layer.

7. A semiconductor device, comprising:

a substrate;

at least a first gate electrode stack including a first gate electrode and a first gate insulator having an upper surface interfacing with the first gate electrode and a lower surface interfacing with the substrate, the first gate insulator having a first permittivity; and at least a second gate electrode stack including a second gate electrode and a second gate insulator having an upper surface, planar with the upper surface of the first gate insulator, interfacing with the second gate electrode and a lower surface interfacing with the substrate, the second gate insulator having a second permittivity different than the first permittivity;

wherein each of the first and second gate insulators consists of a single insulating layer.

8. A semiconductor device, comprising:

a substrate;

at least a first gate electrode stack including a first gate electrode and a first gate insulator having an upper surface interfacing with the first gate electrode and a lower surface interfacing with the substrate, the first gate insulator having a first permittivity and a first thickness; and at least a second gate electrode stack including a second gate electrode and a second gate insulator having an upper surface interfacing with the second gate electrode and a lower surface interfacing with the substrate, the second gate insulator having a second permittivity different than the first permittivity and a second thickness different than the first thickness, wherein the ratio of the first permittivity to the first thickness is equivalent to the ratio of the second permittivity to the second thickness.

* * * * *